(12) United States Patent
Soma et al.

(10) Patent No.: US 7,924,562 B2
(45) Date of Patent: Apr. 12, 2011

(54) POWER SUPPLY UNIT

(75) Inventors: Takaya Soma, Toyota (JP); Hiroshi Yoshida, Anjo (JP); Takeshi Mogari, Nagoya (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 0 days.

(21) Appl. No.: 12/227,120

(22) PCT Filed: May 10, 2007

(86) PCT No.: PCT/JP2007/060091
§ 371 (c)(1),
(2), (4) Date: Nov. 7, 2008

(87) PCT Pub. No.: WO2007/135934
PCT Pub. Date: Nov. 29, 2007

(65) Prior Publication Data
US 2009/0141447 A1    Jun. 4, 2009

(30) Foreign Application Priority Data
May 22, 2006  (JP) ................................. 2006-141352

(51) Int. Cl.
H05K 7/20 (2006.01)
H02J 7/16 (2006.01)
B60H 1/32 (2006.01)
H01M 10/50 (2006.01)
H01M 6/42 (2006.01)

(52) U.S. Cl. .......... 361/694; 320/150; 320/107; 62/239; 429/120; 429/149

(58) Field of Classification Search .......... 361/688–703; 320/150–153, 107, 112; 429/120, 149; 62/239
See application file for complete search history.

(56) References Cited

U.S. PATENT DOCUMENTS
5,796,175 A    8/1998    Itoh et al.
(Continued)

FOREIGN PATENT DOCUMENTS
JP    A-09-046921    2/1997
(Continued)

OTHER PUBLICATIONS
Feb. 2, 2011 European Search Report for European Patent Application No. 10187532.6.

*Primary Examiner* — Jayprakash N Gandhi
*Assistant Examiner* — Jerry Wu
(74) *Attorney, Agent, or Firm* — Oliff & Berridge, PLC

(57) ABSTRACT

A cooling device includes a cooling fan placed in a power storage device, an exhaust port placed in a battery, and a cooling wind flow path for allowing cooling wind taken in from the cooling fan to flow therethrough. In the power storage device and the battery, communication between a gap inside a casing a gap inside a casing can be established via an opening. The cooling wind supplied from the wind blowing fan (F10) flows through the gap formed inside the casing for the power storage device to cool capacitor cells. Subsequently, the cooling wind that has passed through the power storage device is introduced into the inside of the casing for the battery via the opening, and flows through a gap between the upper surface of battery cells and the casing and a gap between the battery cells to cool the battery cells. Thereafter, the cooling wind is emitted to the outside of the casing via the exhaust port.

6 Claims, 7 Drawing Sheets

U.S. PATENT DOCUMENTS

| | | | |
|---|---|---|---|
| 6,052,284 A * | 4/2000 | Suga et al. | 361/699 |
| 6,094,927 A | 8/2000 | Anazawa et al. | |
| 6,094,947 A | 8/2000 | Scatizzi | |
| 2003/0211384 A1 | 11/2003 | Hamada et al. | |
| 2004/0061480 A1 * | 4/2004 | Kimura et al. | 320/150 |
| 2004/0189260 A1 | 9/2004 | Kimoto | |
| 2005/0264257 A1 | 12/2005 | Inui | |
| 2005/0274705 A1 | 12/2005 | Zhu et al. | |
| 2007/0024245 A1 * | 2/2007 | Zhu | 320/150 |

FOREIGN PATENT DOCUMENTS

| | | |
|---|---|---|
| JP | A-10-191503 | 7/1998 |
| JP | 11086915 A * | 3/1999 |
| JP | A-11-086915 | 3/1999 |
| JP | A-11-180168 | 7/1999 |
| JP | A-2000-357539 | 12/2000 |
| JP | A-2001-006651 | 1/2001 |
| JP | A-2001-204106 | 7/2001 |
| JP | A-2003-274565 | 9/2003 |
| JP | A-2005-073443 | 3/2005 |
| JP | 2005108750 A * | 4/2005 |
| JP | A-2005-108750 | 4/2005 |
| JP | A-2006-066126 | 3/2006 |

\* cited by examiner

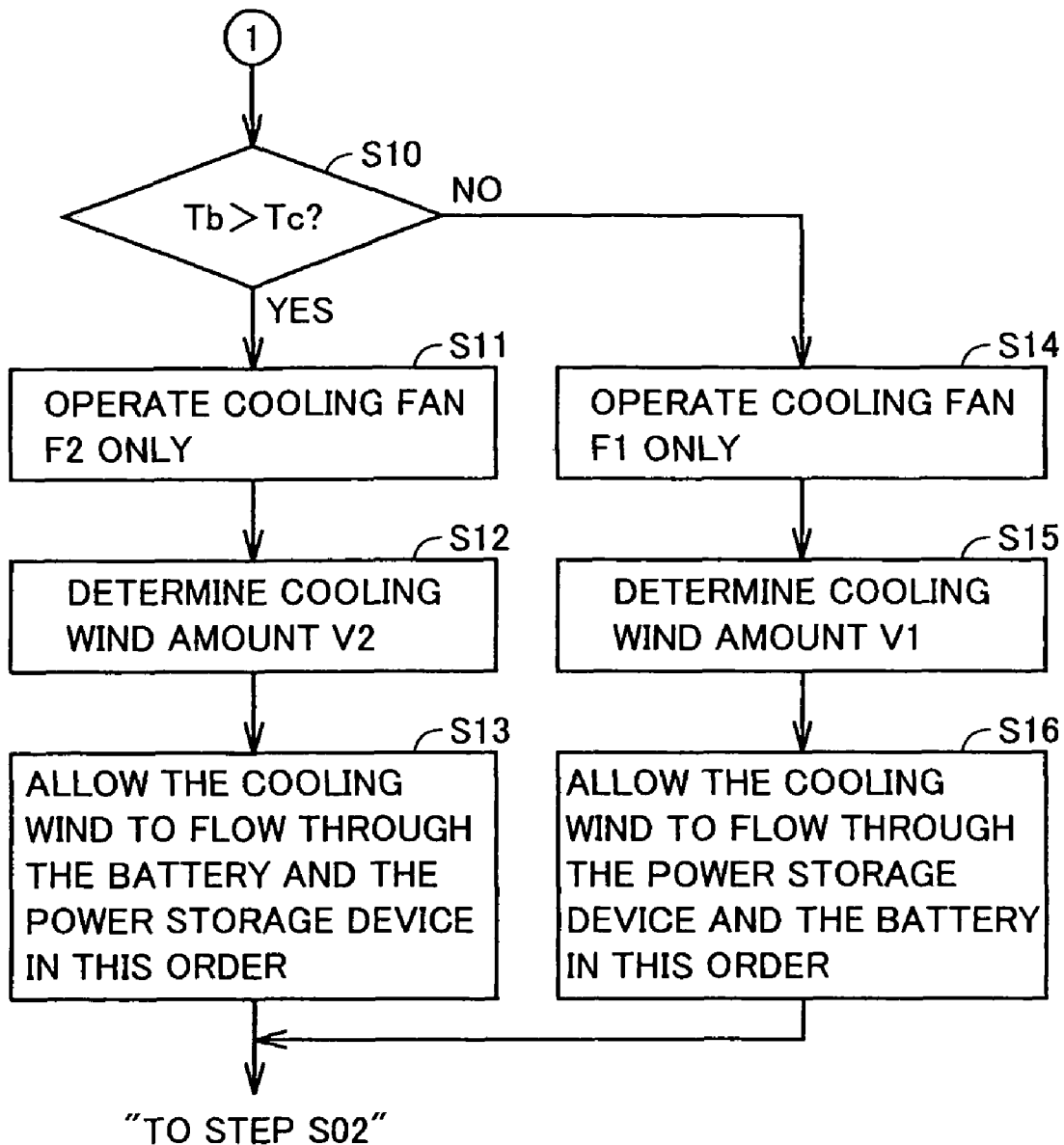

POWER SUPPLY UNIT

TECHNICAL FIELD

The present invention relates to a power supply unit, and in particular, to a power supply unit capable of supplying electric power from a secondary cell and a capacitor.

BACKGROUND ART

In recent years, hybrid vehicles and electric vehicles have been attracting attention as environmentally-friendly vehicles. A hybrid vehicle is a vehicle powered by a direct current (DC) power supply, an inverter, and a motor driven by the inverter, in addition to a conventional engine. Specifically, the hybrid vehicle is powered by driving the engine, and is also powered by converting DC voltage from the DC power supply by the inverter into alternating current (AC) voltage and rotating the motor by the converted AC voltage.

Additionally, an electric vehicle is a vehicle powered by a DC power supply, an inverter, and a motor driven by the inverter.

In such a hybrid vehicle or an electric vehicle, to improve energy efficiency while allowing the vehicle to run appropriately, it is needed to supply electric power according to a load on a motor thereof and to efficiently collect energy during regeneration.

To deal with such a need, for example, Japanese Patent Laying-Open No. 2003-274565 discloses a hybrid type vehicle equipped with a power storage device including a secondary battery and a capacitor connected in parallel as an electric power supply source for a motor.

According to the disclosure, a power storage unit serves as a power supply including a secondary battery and an electric double layer capacitor connected in parallel. During constant-speed running and the like in which load variations in the vehicle are small, a controller operates an electric power generation motor using motive power of an engine to generate electric power, and charges the power storage unit with the generated electric power. The controller also discharges the power storage unit when the vehicle is driven by motive power of a drive motor, when an auxiliary machine for the vehicle is driven, and the like.

A vehicle equipped with a secondary battery serving as an electric power supply source for a motor is generally equipped with a cooling device to suppress an increase in a battery temperature due to heat generated inside the secondary battery during charge/discharge (see for example Japanese Patent Laying-Open Nos. 11-180168 and 2001-6651).

According to the disclosures, cooling wind generated by driving a cooling fan is supplied to a battery box housing a plurality of battery cells. The supplied cooling wind flows through a gap provided between the battery cells, and thereby the battery cells are cooled.

In a vehicle including a secondary battery and a capacitor as an electric power supply source for a motor as the one disclosed in Japanese Patent Laying-Open No. 2003-274565, internal heat generation also occurs in the capacitor as well as in the secondary battery, due to charge/discharge. Therefore, a cooling device is also needed for the capacitor.

The amounts of heat generated in the secondary battery and the capacitor during charge/discharge are different, depending on the magnitude of an internal resistance, the presence or absence of a chemical reaction, and the like. Accordingly, consideration has been given on a configuration in which a cooling device is provided separately for each of a secondary battery and a capacitor, and the amount of cooling wind to be supplied from the cooling fan is individually controlled based on the temperature of each of the secondary battery and the capacitor.

However, such a configuration requires to be provided with a plurality of cooling fans, resulting in an increase in the size of the entire cooling device, and thus the configuration may not be suitable to be mounted in a vehicle having severe mounting space constraints. Further, since the amount of cooling wind is controlled for each of the plurality of the cooling fans, there arises a problem that the control is complicated.

Furthermore, since the secondary battery and the capacitor have a temperature range suitable to maintain chargeable/dischargeable electric power, further improvement in the response of electric power supply to a motor is expected if these can be adjusted to have temperatures falling within the temperature range.

Accordingly, the present invention has been made to solve such a problem, and one object of the present invention is to provide a power supply unit including a cooling device that is smaller in size and has a simple configuration.

Another object of the present invention is to provide a power supply unit capable of adjusting temperature with a simple configuration.

DISCLOSURE OF THE INVENTION

According to the present invention, a power supply unit includes: a first power supply provided to be capable of supplying electric power to a load, and having a relatively large amount of heat generated by charge/discharge associated with driving the load; a second power supply connected to the load in parallel with the first power supply, and having a relatively small amount of heat generated by charge/discharge associated with driving the load; and a cooling device cooling the first power supply and the second power supply. The cooling device includes a cooling medium supply unit supplying a cooling medium to an upstream part of the second power supply, and a cooling medium flow path formed to allow the cooling medium supplied by the cooling medium supply unit to flow through the second power supply into the first power supply.

According to the power supply unit described above, by allowing the cooling medium to flow, through the second power supply with a lower temperature, into the first power supply with a higher temperature, the first power supply and the second power supply can be cooled using a common cooling device. As a result, the entire power supply unit can be configured to be compact.

Preferably, the first power supply includes a first substrate having a first main surface on which a plurality of first power supply cells are mounted, and a first casing housing the first substrate and provided with a first communication path for emitting the cooling medium flowing through the cooling medium flow path to an outside of the power supply unit. The second power supply includes a second substrate having a first main surface on which a plurality of second power supply cells are mounted, and a second casing housing the second substrate and provided with a second communication path for introducing the cooling medium from the cooling medium supply unit into the cooling medium flow path. The first communication path and the second communication path are connected by a third communication path to allow communication therebetween. The second casing is placed in contact with the first casing to allow heat transfer with a second main surface of the first substrate.

According to the power supply unit described above, by allowing the cooling medium to flow, through the second power supply with a lower temperature, into the first power supply with a higher temperature, and by causing heat transfer to be performed between the casings for the first power supply and the second power supply, a common cooling device can be employed and cooling efficiency can be enhanced.

Preferably, the third communication path is made of a plurality of ventilation holes formed in a bonding surface between the first casing and the second casing. The plurality of ventilation holes are formed to have opening areas increased with distance from the cooling medium supply unit.

According to the power supply unit described above, the cooling medium to be supplied to the first power supply is prevented from being supplied unevenly inside the casing. Therefore, the first power supply can be cooled evenly, and cooling efficiency can be further enhanced.

According to another aspect of the present invention, a power supply unit includes: a first power supply provided to be capable of supplying electric power to a load, and having a relatively large amount of heat generated by charge/discharge associated with driving the load; a second power supply connected to the load in parallel with the first power supply, and having a relatively small amount of heat generated by charge/discharge associated with driving the load; and a temperature adjustment device adjusting temperatures of the first power supply and the second power supply. The temperature adjustment device includes a cooling medium supply unit supplying a cooling medium to an upstream part of the first power supply, and a cooling medium flow path formed to allow the cooling medium supplied from the cooling medium supply unit to flow through the first power supply into the second power supply.

According to the power supply unit described above, under low temperature circumstances, the temperature of the second power supply with a lower temperature can be increased using thermal energy collected from the first power supply with a higher temperature. Therefore, a reduction in chargeable/dischargeable electric power of an electric power supply source can be suppressed.

Preferably, the first power supply includes a first substrate having a first main surface on which a plurality of first power supply cells are mounted, and a first casing housing the first substrate and provided with a first communication path for introducing the cooling medium from the cooling medium supply unit into the cooling medium flow path. The second power supply includes a second substrate having a first main surface on which a plurality of second power supply cells are mounted, and a second casing housing the second substrate and provided with a second communication path for emitting the cooling medium flowing through the cooling medium flow path to an outside of the power supply unit. The first communication path and the second communication path are connected by a third communication path to allow communication therebetween. The first casing is placed in contact with the second casing to allow heat transfer with a second main surface of the second substrate.

According to the power supply unit described above, by allowing the cooling medium to flow, through the first power supply with a higher temperature, into the second power supply with a lower temperature, and by causing heat transfer to be performed between the casings for the first power supply and the second power supply, the temperature of the second power supply can be increased efficiently.

Preferably, the third communication path is made of a plurality of ventilation holes formed in a bonding surface between the first casing and the second casing. The plurality of ventilation holes are formed to have opening areas increased with distance from the cooling medium supply unit.

According to the power supply unit described above, the cooling medium to be supplied to the second power supply is prevented from being supplied unevenly inside the casing. Therefore, the temperature of the second power supply can be increased evenly, and temperature-increasing efficiency can be further enhanced.

According to another aspect of the present invention, a power supply unit includes: a first power supply provided to be capable of supplying electric power to a load; a second power supply connected to the load in parallel with the first power supply; and a temperature adjustment device adjusting temperatures of the first power supply and the second power supply. The temperature adjustment device includes: a cooling medium flow path formed such that the first power supply and the second power supply are placed in series along a direction in which a cooling medium flows; a first cooling medium supply unit provided at one end of the cooling medium flow path in the second power supply for supplying the cooling medium to an upstream part of the second power supply; a second cooling medium supply unit provided at the other end of the cooling medium flow path in the first power supply for supplying the cooling medium to an upstream part of the first power supply; and selection means selectively operating either one of the first cooling medium supply unit and the second cooling medium supply unit based on an ambient temperature of the power supply unit, the temperature of the power supply, and the temperature of the power storage device.

According to the power supply unit described above, cooling and increasing temperature can be selectively performed using the cooling medium flowing through the first power supply and the second power supply in common. Therefore, the temperature adjustment device for the first power supply and the second power supply can be simply configured.

Preferably, when the ambient temperature of the power supply unit is higher than a prescribed threshold value, the selection means selects the first cooling medium supply unit in response to the temperature of the first power supply being higher than the temperature of the second power supply, and selects the second cooling medium supply unit in response to the temperature of the second power supply being higher than the temperature of the first power supply.

According to the power supply unit described above, when the power supply unit is at an ordinary temperature, the first power supply and the second power supply can be cooled using a common cooling medium by selecting a cooling medium flow path such that the cooling medium flows from a lower temperature to a higher temperature.

Preferably, when the ambient temperature of the power supply unit is not more than the prescribed threshold value, the selection means selects the second cooling medium supply unit in response to the temperature of the first power supply being higher than the temperature of the second power supply, and selects the first cooling medium supply unit in response to the temperature of the second power supply being higher than the temperature of the first power supply.

According to the power supply unit described above, when the power supply unit is at a low temperature, the temperature of one power supply can be increased using thermal power collected from the other power supply by selecting a cooling medium flow path such that the cooling medium flows from a higher temperature to a lower temperature.

Preferably, the power supply unit further includes control means controlling a supply amount of the cooling medium to be supplied to the cooling medium flow path. The control means determines the supply amount of the cooling medium based on the temperature of the first power supply when the temperature of the first power supply is higher than the temperature of the second power supply, and determines the supply amount of the cooling medium based on the temperature of the second power supply when the temperature of the second power supply is higher than the temperature of the first power supply.

According to the power supply unit described above, by determining the supply amount of the cooling medium based on the temperature of the power supply with a higher temperature, temperature adjustment can be performed efficiently also by using the cooling medium in common.

Preferably, the first power supply is a secondary battery, and the second power supply is a capacitor.

According to the power supply unit described above, a reduction in the chargeable/dischargeable electric power of the secondary battery and the capacitor can be suppressed. Therefore, drive response of the load by the combined use thereof can be maintained.

Preferably, the load is a motor for driving a vehicle, and the power supply unit is mounted in the vehicle as an electric power source for the motor.

According to the power supply unit described above, a power supply unit reduced in size can be obtained, which is suitable to be mounted in a vehicle having severe mounting space constraints.

According to the present invention, a power supply unit including a cooling device that is smaller in size and has a simple configuration can be implemented.

Further, temperatures of a plurality of power supplies constituting the power supply unit can be adjusted with a simple configuration.

BRIEF DESCRIPTION OF THE DRAWINGS

FIG. 9 is a flow chart for illustrating drive control for the cooling device of FIG. 7.

BEST MODES FOR CARRYING OUT THE INVENTION

Figure 1:
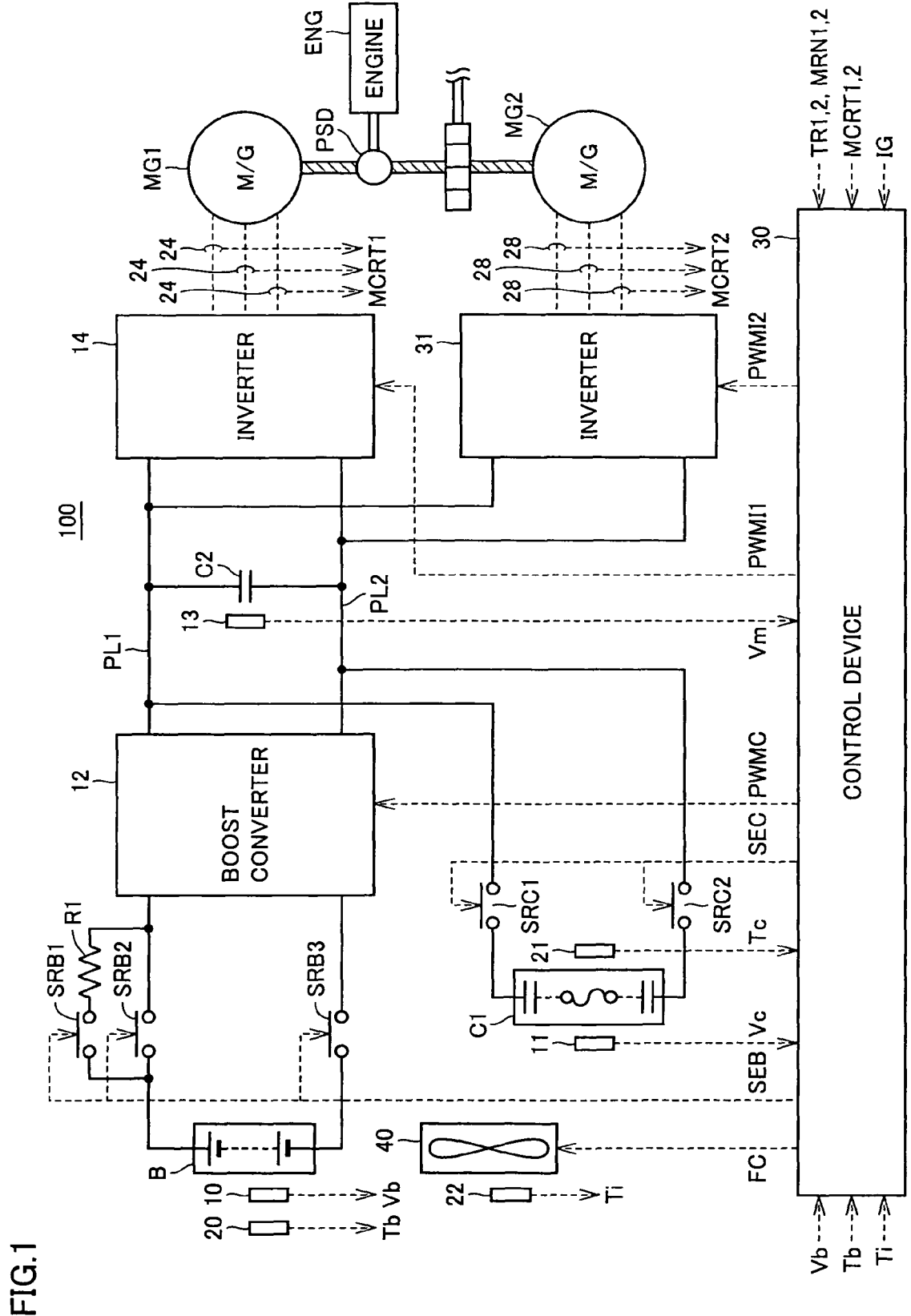
FIG. 1 is a schematic block diagram of a motor drive device to which a power supply unit in accordance with a first embodiment of the present invention is applied.

Hereinafter, embodiments of the present invention will be described in detail with reference to the drawings, in which identical or corresponding parts will be designated by the same reference numerals, and the description thereof will not be repeated.

First Embodiment

FIG. 1 is a schematic block diagram of a motor drive device to which a power supply unit in accordance with a first embodiment of the present invention is applied.

Referring to FIG. 1, a motor drive device 100 includes a battery B, a boost converter 12, a power storage device C1, a capacitor C2, inverters 14 and 31, voltage sensors 10, 11, and 13, current sensors 24 and 28, temperature sensors 20-22, a cooling device 40, system relays SRB1-SRB3, SRC1, and SRC2, a resistor R1, and a control device 30.

An engine ENG generates drive force using combustion energy of a fuel such as gasoline as a source. The drive force generated by engine ENG is split by a motive power split mechanism PSD into two paths, as indicated by thick diagonal lines in FIG. 1. One is a path transmitting the split drive force to a drive shaft driving wheels via a decelerator not shown, and the other is a path transmitting the split drive force to a motor generator MG1.

While motor generators MG1 and MG2 can serve both as a generator and as a motor, motor generator MG1 mainly operates as a generator, and motor generator MG2 mainly operates as a motor, as described below.

Specifically, motor generator MG1 is a three-phase AC rotating machine, and used as a starter starting engine ENG at the time of acceleration. On this occasion, motor generator MG1 receives electric power supply from battery B and/or power storage device C1 and is driven as a motor, and cranks and starts engine ENG.

Further, after engine ENG is started, motor generator MG1 is rotated by the drive force of engine ENG transmitted via motive power split mechanism PSD, and generates electric power.

The electric power generated by motor generator MG1 is used for different purposes, depending on a running state of a vehicle, stored energy in power storage device C1, and the amount of charge in battery B. For example, at the time of normal running and abrupt acceleration, the electric power generated by motor generator MG1 is directly used as electric power for driving motor generator MG2. In contrast, when the amount of charge in battery B or the stored energy in power storage device C1 is lower than a prescribed value, the electric power generated by motor generator MG1 is converted from AC power into DC power by inverter 14, and stored in battery B or power storage device C1.

Motor generator MG2 is a three-phase AC rotating machine, and driven by at least either one of the electric power stored in battery B and power storage device C1 and the electric power generated by motor generator MG1. Drive force of motor generator MG2 is transmitted to the drive shaft of the wheels via the decelerator. Thereby, motor generator MG2 assists engine ENG to cause the vehicle to run, or causes the vehicle to run only by its own drive force.

Further, at the time of regenerative braking of the vehicle, motor generator MG2 is rotated by the wheels via the decelerator and operates as a generator. On this occasion, regenerative electric power generated by motor generator MG2 is charged in battery B and power storage device C1 via inverter 31.

Battery B is a secondary battery such as a nickel hydride battery or a lithium ion battery. Battery B may also be a fuel battery. Voltage sensor 10 detects a DC voltage Vb output from battery B, and outputs the detected DC voltage Vb to control device 30. Temperature sensor 20 detects a temperature Tb of battery B (hereinafter also referred to as a battery temperature), and outputs the detected battery temperature Tb to control device 30.

System relay SRB1 and resistor R1 are connected in series between a positive electrode of battery B and boost converter 12. System relay SRB2 is connected between the positive electrode of battery B and boost converter 12, in parallel with system relay SRB1 and resistor R1. System relay SRB3 is connected between a negative electrode of battery B and boost converter 12.

System relays SRB1-SRB3 are turned on/off by a signal SEB from control device 30. More specifically, system relays SRB1-SRB3 are turned on by signal SEB at an H (logical high) level from control device 30, and turned off by signal SEB at an L (logical low) level from control device 30.

Boost converter 12 boosts DC voltage Vb supplied from battery B to a boost voltage having an arbitrary level, and supplies the boost voltage to capacitor C2. More specifically, upon receiving a signal PWMC from control device 30, boost converter 12 supplies DC voltage Vb boosted in response to signal PWMC to capacitor C2. Further, upon receiving signal PWMC from control device 30, boost converter 12 lowers a DC voltage supplied from inverter 14 and/or inverter 31 via capacitor C2, and charges battery B.

Power storage device C1 is connected to a power supply line PL1 and to an earth line PL2 in parallel with battery B. Power storage device C1 includes a plurality of capacitors connected in series. The plurality of capacitors are composed for example of electric double layer capacitors. Voltage sensor 11 detects a voltage Vc across power storage device C1 (hereinafter also referred to as an inter-terminal voltage), and outputs the detected voltage Vc to control device 30. Temperature sensor 21 detects a temperature Tc of power storage device C1 (hereinafter also referred to as a capacitor temperature), and outputs the detected capacitor temperature Tc to control device 30.

System relay SRC1 is connected between power supply line PL1 and a positive electrode of power storage device C1. System relay SRC2 is connected between earth line PL2 and a negative electrode of power storage device C1. System relays SRC1 and SRC2 are turned on/off by a signal SEC from control device 30. More specifically, system relays SRC1 and SRC2 are turned on by signal SEC at an H level from control device 30, and turned off by signal SEC at an L level from control device 30.

Capacitor C2 smoothes the DC voltage boosted by boost converter 12, and supplies the smoothed DC voltage to inverters 14 and 31. Voltage sensor 13 detects a voltage Vm across capacitor C2 (equivalent to an input voltage of inverters 14 and 31), and outputs the detected voltage Vm to control device 30.

Upon receiving the DC voltage from boost converter 12 or power storage device C1 via capacitor C2, inverter 14 converts the DC voltage into a three-phase AC voltage based on a control signal PWMI1 from control device 30, and drives motor generator MG1. Thereby, motor generator MG1 is driven to generate a torque designated by a torque command value TR1.

Further, at the time of regenerative braking of a hybrid vehicle equipped with motor drive device 100, inverter 14 converts an AC voltage generated by motor generator MG1 into a DC voltage based on signal PWMI1 from control device 30, and supplies the converted DC voltage to power storage device C1 or boost converter 12 via capacitor C2. The regenerative braking referred to herein includes braking with regeneration through a foot brake operation by a driver of the hybrid vehicle, and deceleration (or stopping acceleration) of the vehicle while regenerating power by releasing an accelerator pedal during running without operating the foot brake.

Upon receiving the DC voltage from boost converter 12 or power storage device C1 via capacitor C2, inverter 31 converts the DC voltage into an AC voltage based on a control signal PWMI2 from control device 30, and drives motor generator MG2. Thereby, motor generator MG2 is driven to generate a torque designated by a torque command value TR2.

Further, at the time of regenerative braking of the hybrid vehicle equipped with motor drive device 100, inverter 31 converts an AC voltage generated by motor generator MG2 into a DC voltage based on signal PWMI2 from control device 30, and supplies the converted DC voltage to power storage device C1 or boost converter 12 via capacitor C2.

Current sensor 24 detects a motor current MCRT1 flowing into motor generator MG1, and outputs the detected motor current MCRT1 to control device 30. Current sensor 28 detects a motor current MCRT2 flowing into motor generator MG2, and outputs the detected motor current MCRT2 to control device 30.

Control device 30 receives torque command values TR1 and TR2 and motor rotation numbers MRN1 and MRN2 from an external electronic control unit (ECU) not shown, and receives a signal IG from an ignition key (not shown). Signal IG is at an H level or at an L level.

Further, control device 30 receives DC voltage Vb from voltage sensor 10, inter-terminal voltage Vc of power storage device C1 from voltage sensor 11, voltage Vm from voltage sensor 13, motor current MCRT1 from current sensor 24, and motor current MCRT2 from current sensor 28.

Based on input voltage Vm of inverter 14, torque command value TR1, and motor current MCRT1, control device 30 generates signal PWMI1 for controlling switching of IGBT elements (not shown) of inverter 14 when inverter 14 drives motor generator MG1, and outputs the generated signal PWMI1 to inverter 14.

Further, based on input voltage Vm of inverter 31, torque command value TR2, and motor current MCRT2, control device 30 generates signal PWMI2 for controlling switching of IGBT elements (not shown) of inverter 31 when inverter 31 drives motor generator MG2, and outputs the generated signal PWMI2 to inverter 31.

In addition, when inverter 14 drives motor generator MG1, control device 30 generates signal PWMC for controlling switching of IGBT elements (not shown) of boost converter 12, based on DC voltage Vb of battery B, input voltage Vm of inverter 14, torque command value TR1, and motor rotation number MRN1, and outputs the generated signal PWMC to boost converter 12.

Further, when inverter 31 drives motor generator MG2, control device 30 generates signal PWMC for controlling switching of the IGBT elements (not shown) of boost converter 12, based on DC voltage Vb of battery B, input voltage Vm of inverter 31, torque command value TR2, and motor rotation number MRN2, and outputs the generated signal PWMC to boost converter 12.

In addition, at the time of regenerative braking of the hybrid vehicle equipped with motor drive device 100, control device 30 generates signal PWMI2 for converting the AC voltage generated by motor generator MG2 into a DC voltage, based on input voltage Vm of inverter 31, torque command value TR2, and motor current MCRT2, and outputs the generated signal PWMI2 to inverter 31.

As described above, motor drive device 100 in accordance with the present invention uses electric power stored in power storage device C1, in addition to electric power stored in battery B, as electric power required when motor generators MG1 and MG2 are driven in a power running mode. Further, motor drive device 100 stores electric power generated when motor generators MG1 and MG2 are driven in a regenerative mode in battery B and power storage device C1. In particular, by employing large-capacity electric double layer capacitors as capacitors constituting power storage device C1, electric power can be quickly supplied to motor generators MG1 and MG2, and response when the motor is driven can be enhanced. As a result, running performance of the vehicle can be ensured.

When power storage device C1 is mounted in motor drive device 100, it becomes necessary to provide not only battery B but also power storage device C1 with a cooling device for suppressing an increase in temperature due to internal heat generation during charge/discharge.

Since the amounts of heat generated during charge/discharge operation are different in power storage device C1 and battery B, both battery B and power storage device C1 can be cooled reliably if a separate cooling device is provided to power storage device C1, in addition to a cooling device for battery B, to individually control the supply amount of a cooling medium.

On the other hand, when a cooling device is provided to each of battery B and power storage device C1, there arise problems that the size of the entire motor drive device 100 is increased, and that the control of the cooling devices becomes complicated.

Accordingly, the power supply unit in accordance with the present invention employs a configuration in which one common cooling device 40 is used to cool battery B and power storage device C1. Hereinafter, a configuration of cooling device 40 will be described.

Figure 2:
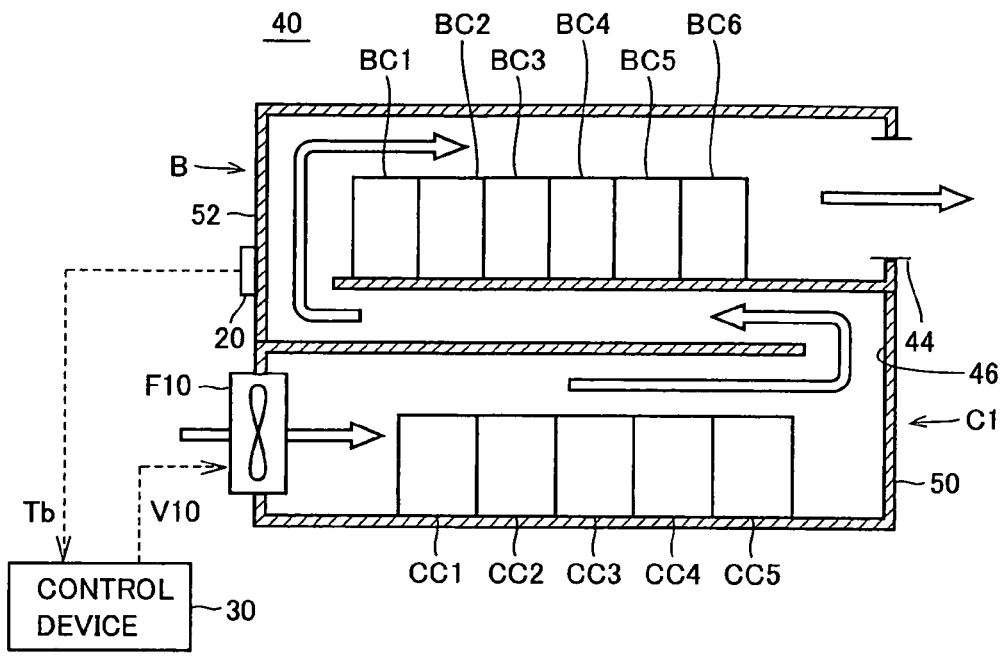
FIG. 2 is a schematic configuration diagram of a cooling device of FIG. 1.

FIG. 2 is an overall configuration diagram of a cooling device in accordance with the first embodiment of the present invention.

Referring to FIG. 2, cooling device 40 includes a cooling fan F10 placed in power storage device C1, an exhaust port 44 placed in battery B, and a cooling wind flow path for allowing cooling wind taken in from cooling fan F10 to flow therethrough.

Specifically, power storage device C1 has a structure in which a casing 50 as an outer packaging member houses a plurality of capacitor cells CC1-CC5 mounted on the bottom surface of casing 50. A gap as the cooling wind flow path is formed between the upper surface of the plurality of capacitor cells CC1-CC5 and casing 50 and between the stacked capacitor cells. The gap is in communication with a gap formed in a casing 52 for battery B on a side downstream of capacitor cells CC1-CC5, as described later.

Battery B has a structure in which casing 52 as an outer packaging member houses therein a substrate on which a plurality of stacked battery cells BC1-BC6 are mounted. A gap as the cooling wind flow path is formed between the upper surface of battery cells BC1-BC6 and casing 52, between the rear surface of the substrate on which battery cells BC1-BC6 are mounted and casing 52, and between the stacked battery cells.

Battery B and power storage device C1 are placed such that casing 52 is stacked above casing 50 as shown in FIG. 2. In this instance, an opening 46 is provided in a contact surface between casing 50 and casing 52, which allows communication between the gap inside casing 50 and the gap inside casing 52. Opening 46 is provided in the cooling wind flow path on the side downstream of capacitor cells CC1-CC5.

Cooling fan F10 is placed on one side surface of casing 50 for power storage device C1. An intake duct (not shown) for taking in the cooling wind is provided on a side upstream of cooling fan F10.

Exhaust port 44 is placed in one side surface of casing 52 for battery B. An exhaust duct (not shown) for emitting the cooling wind that has flown through the cooling wind flow path to the outside is provided on a side downstream of exhaust port 44.

In the configuration described above, the cooling wind taken in from cooling fan F10 flows along a direction indicated by arrows in the drawing. Specifically, the cooling wind firstly flows through the gap formed inside casing 50 for power storage device C1. Thereby, capacitor cells CC1-CC5 are cooled. Subsequently, the cooling wind that has passed through capacitor cells CC1-CC5 is introduced into the inside of casing 52 for battery B via opening 46. As indicated by the arrows in the drawing, the cooling wind introduced into the inside of casing 52 flows through the gap between the rear surface of the substrate on which battery cells BC1-BC6 are mounted and casing 52, and thereafter flows into the gap between the upper surface of battery cells BC1-BC6 and casing 52. Then, the cooling wind flows through the gap between the upper surface of battery cells BC1-BC6 and casing 52 and the gap between the battery cells, and cools battery cells BC1-BC6. After cooling battery cells BC1-BC6, the cooling wind is emitted to the outside of casing 52 via exhaust port 44.

According to cooling device 40 of FIG. 2, after cooling power storage device C1, the cooling wind is used to cool battery B. This is based on that power storage device C1 has a relatively small amount of heat generated by charge/discharge associated with driving a load when compared with battery B, and thus has a temperature lower than that of battery B, as described below.

Specifically, in motor drive device 100 of FIG. 1, the electric double layer capacitors constituting power storage device C1 can perform quick charge/discharge, when compared with the secondary battery constituting battery B. Therefore, when a large power output is required in a short period of time, such as at the time of accelerating the hybrid vehicle or starting the engine, the response when the motor is driven can be ensured by causing mainly power storage device C1 to supply electric power to motor generators MG1 and MG2.

Figure 3:
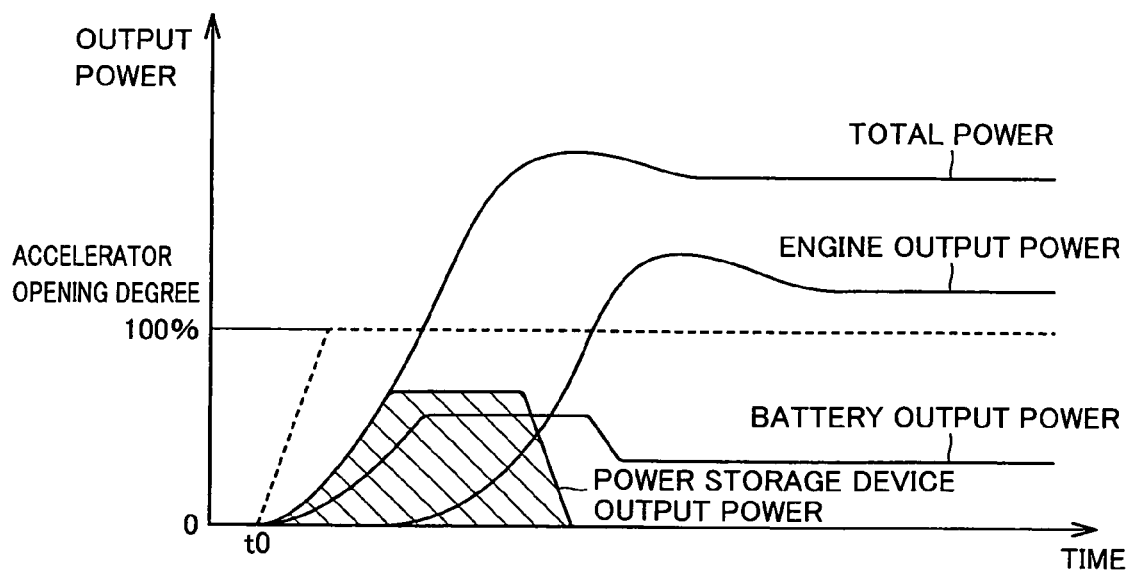
FIG. 3 is a timing chart for illustrating output power configuration at the time of accelerating a hybrid vehicle.

FIG. 3 is a timing chart for illustrating output power configuration at the time of accelerating a hybrid vehicle.

Referring to FIG. 3, in response to an accelerator being fully opened (i.e., the accelerator opening degree being 100%) with a time point t0 as a starting point, output power of the entire vehicle (total power) is increased as power generated by motor generator MG2 is added to output power generated by the engine (engine output power).

On this occasion, motor generator MG2 generates output power using electric energy supplied from battery B and power storage device C1 as a source. As to the supplied electric energy, output power is firstly supplied from power storage device C1 capable of quick discharge, followed by output power supplied from battery B. The output power from power storage device C1 (corresponding to a shaded region in the drawing) corresponds to a voltage difference between inter-terminal voltage Vc of power storage device C1 and a system voltage of motor drive device 100 (corresponding to input voltage Vm of inverters 14 and 31).

Thus, since the output power of motor generator MG2 is immediately increased by quick electric power supply from power storage device C1 when the accelerator is fully opened for acceleration, the output power of the entire vehicle can be increased in a short period of time. Thereby, smooth and responsive acceleration characteristic is achieved.

Since power storage device C1 serves to assist battery B as described above, a time period for which power storage device C1 is energized when it supplies electric power to motor generator MG2 is relatively shorter than a time period for which battery B is energized. Accordingly, the amount of heat generated inside power storage device C1 is relatively smaller than the amount of heat generated inside battery B, and thus power storage device C1 generally has a temperature lower than that of battery B.

Therefore, the power supply unit in accordance with the present embodiment is configured to employ the cooling structure shown in FIG. 2 in cooling device 40 of FIG. 1 to cool battery B and power storage device C1 using common cooling wind.

Specifically, cooling device 40 has a characteristic that power storage device C1 with a lower temperature is placed upstream of battery B with a higher temperature in a cooling medium flow path. With such placement, cooling wind flows through power storage device C1 into battery B, and thereby battery B and power storage device C1 can be cooled using common cooling wind. As a result, the entire motor drive device can be reduced in size, when compared with the case where a cooling device is provided to each of battery B and power storage device C1.

Further, both battery B and power storage device C1 can be cooled reliably by determining the amount of blowing the cooling wind supplied from cooling fan F10 to the cooling wind flow path based on the temperature of battery B with a higher temperature.

Specifically, control device 30 determines a wind blowing amount V10 of cooling fan F10 based on battery temperature Tb from temperature sensor 20, generates a signal V10 indicating the determined wind blowing amount V10, and outputs signal V10 to cooling fan F10.

Thereby, in cooling fan F10, a control duty command value for an inverter driving an internal fan motor is determined to obtain wind blowing amount V10 indicated by signal V10. Then, based on the determined control duty command value, the inverter converts DC power from an auxiliary battery into AC power and drives the fan motor. As a result, the cooling wind having wind blowing amount V10 taken in from cooling fan F10 and supplied to an upstream side of power storage device C1 firstly cools power storage device C1 with a lower temperature, and then cools battery B with a higher temperature.

Further, cooling device 40 of FIG. 2 can cool battery B more efficiently, as power storage device C1 and battery B are placed such that casing 52 is stacked above casing 50.

Specifically, heat generated inside battery cells BC1-BC6 is transferred to casing 52 for power storage device C1 through the substrate on which these battery cells are mounted and the gap formed on the rear surface of the substrate. That is, since power storage device C1 has a temperature lower than that of battery B, battery cells BC1-BC6 can be cooled not only by heat exchange with the cooling wind but also by heat exchange with casing 52 for power storage device C1. As a result, battery B can be cooled efficiently.

It is to be noted that the heat transferred to casing 50 for power storage device C1 is not transferred to capacitor cells CC1-CC5, because it is absorbed by the cooling wind flowing through the inside of casing 50.

MODIFICATION

Figure 4:
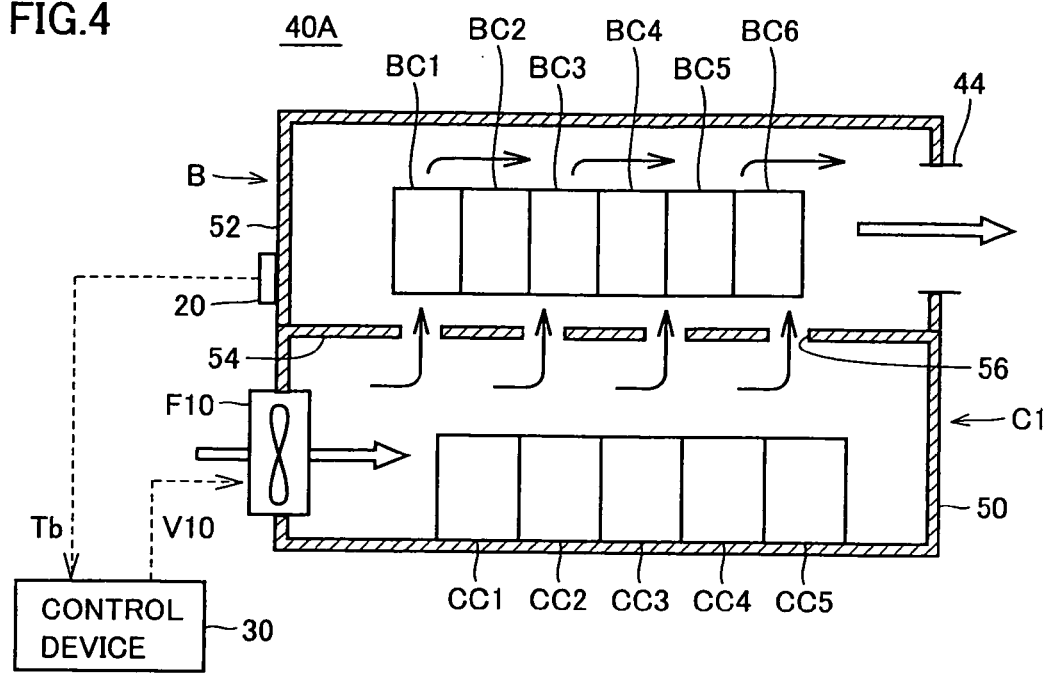
FIG. 4 is an overall configuration diagram of a cooling device in accordance with a modification of the first embodiment of the present invention.

FIG. 4 is an overall configuration diagram of a cooling device in accordance with a modification of the first embodiment of the present invention. In a cooling device 40A of FIG. 4, the structure of a portion where casing 50 for power storage device C1 is in contact with casing 52 for battery B is modified, when compared with cooling device 40 of FIG. 2. Therefore, the detailed description of parts identical to those in FIG. 2 will not be repeated.

Referring to FIG. 4, battery B and power storage device C1 are placed such that casing 52 is stacked above casing 50. The upper side surface of casing 50 and the lower side surface of casing 52 are bonded by a bonding surface 54.

Bonding surface 54 has a plurality of openings 56. The gap inside casing 50 is in communication with the gap inside casing 52 via the plurality of openings 56.

In the configuration described above, the cooling wind taken in from cooling fan F10 flows along a direction indicated by arrows in the drawing. Specifically, the cooling wind firstly flows through the gap formed inside casing 50 for power storage device C1. Thereby, capacitor cells CC1-CC5 are cooled. Subsequently, the cooling wind that has passed through capacitor cells CC1-CC5 is introduced into the inside of casing 52 for battery B via the plurality of openings 56. As indicated by the arrows in the drawing, the cooling wind introduced into the inside of casing 52 flows through the gap between battery cells BC1-BC6 and casing 52 and the gap between the battery cells, and cools battery cells BC1-BC6. After cooling battery cells BC1-BC6, the cooling wind is emitted to the outside of casing 52 via exhaust port 44.

Specifically, in cooling device 40A of FIG. 4, the plurality of openings 56 provided in bonding surface 54 serve as ventilation holes for introducing the cooling wind that has flown through the inside of power storage device C1 into the inside of battery B.

Of the plurality of openings 56, the opening located upstream in the cooling wind flow path and the opening located downstream in the cooling wind flow path have different flow path lengths from a position of supplying the cooling wind (corresponding to cooling fan F10). Accordingly, they have different pressure losses due to resistance in the flow path, resulting in uneven wind blowing amounts. Thereby, in battery B receiving supply of the cooling wind that has passed through openings 56, it becomes difficult to cool battery cells BC1-BC6 evenly.

Therefore, cooling device 40A in accordance with the present modification is configured such that the plurality of openings 56 provided in bonding surface 54 are formed to have different opening areas along the direction in which the cooling wind flows.

Figure 5:
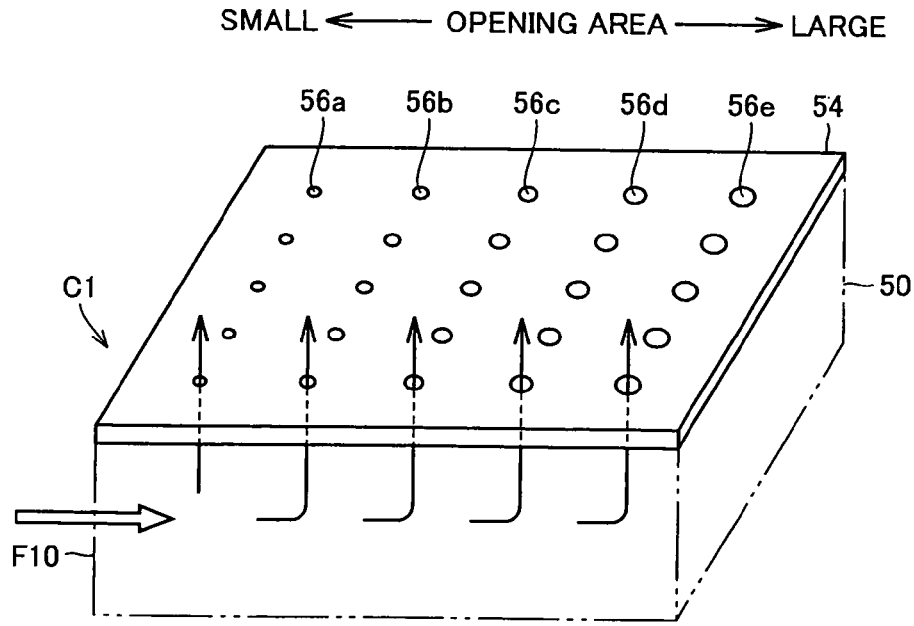
FIG. 5 shows a configuration of a bonding surface of FIG. 4.

Specifically, as shown in FIG. 5, the plurality of openings 56 are formed to have a larger opening area as they are positioned more downstream in the cooling wind flow path. In the example of FIG. 5, an opening 56a located closest to cooling fan F10 is formed to have the smallest opening area, and an opening 56e located farthest from cooling fan F10 is formed to have the largest opening area. The opening areas of openings 56a-56e are set to eliminate the difference in pressure loss due to the difference in the flow path length of the cooling wind flow path from cooling fan F10 to each opening.

Consequently, according to cooling device 40A in accordance with the present modification, the cooling wind can be supplied to the individual battery cells in an even amount. As a result, battery B can be cooled evenly, and cooling efficiency can be further enhanced.

As described above, according to the first embodiment of the present invention, a battery and a power storage device serving as an electric power supply source for a motor can be cooled using a common cooling device, and thus an entire motor drive device can be configured to be compact.

Although the configuration in which a power storage device is placed above a battery has been described in the present embodiment, the positional relationship between the battery and the power storage device is not necessarily limited thereto, as long as the power storage device is placed upstream of the battery in a cooling medium flow path. Therefore, a configuration in which a battery is placed above a power storage device, or a configuration in which a power storage device and a battery are placed side by side in a horizontal direction may be implemented.

Second Embodiment

As described in the aforementioned first embodiment, both power storage device C1 and battery B can be cooled efficiently using common cooling wind by stacking battery B with a higher temperature above power storage device C1 with a lower temperature and forming the cooling wind flow path to allow the cooling wind to flow from power storage device C1 with a lower temperature to battery B with a higher temperature.

On the other hand, under low temperature circumstances, a reduction in the temperature of power storage device C1 may cause a reduction in the chargeable/dischargeable electric power of power storage device C1. In this case, quick electric power supply from power storage device C1 becomes impossible, deteriorating acceleration characteristic of a hybrid vehicle.

Figure 6:
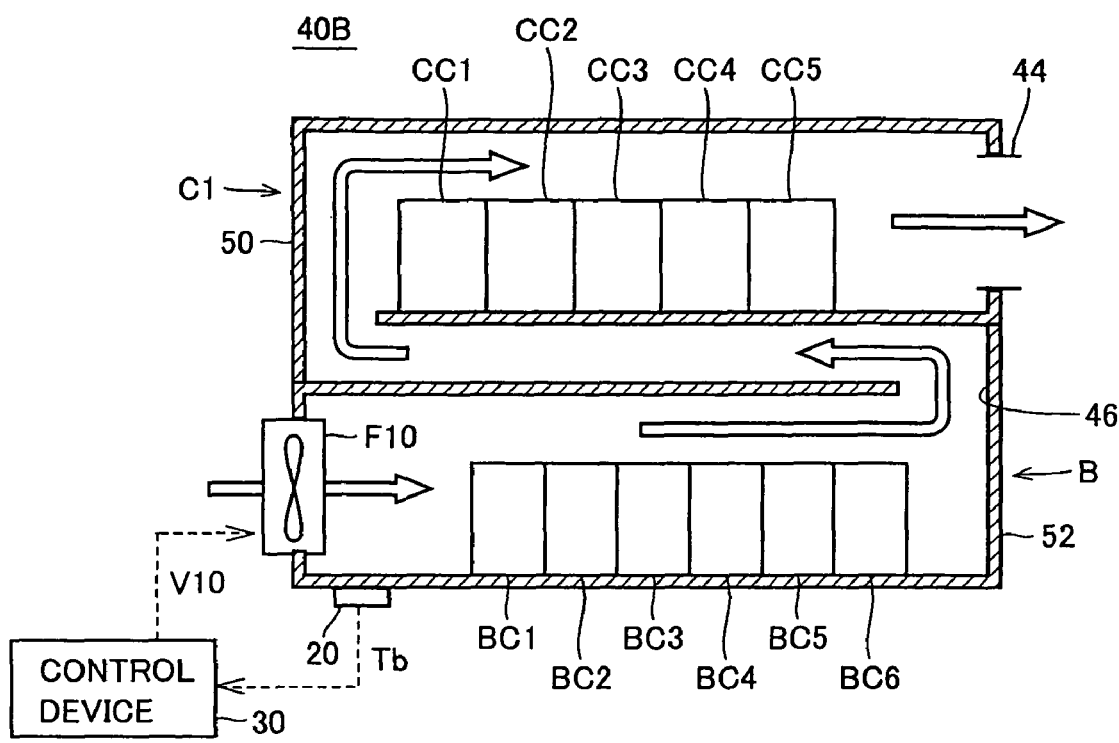
FIG. 6 is an overall configuration diagram of a cooling device in accordance with a second embodiment of the present invention.

Therefore, under low temperature circumstances such as in a cold region, degradation in charge/discharge characteristic can be suppressed by employing a cooling structure shown in FIG. 6 in cooling device 40 of FIG. 1 to increase the temperature of power storage device C1.

FIG. 6 is an overall configuration diagram of a cooling device in accordance with a second embodiment of the present invention.

Referring to FIG. 6, in a cooling device 40B, the vertical positional relationship in the placement of battery B and power storage device C1 is changed, when compared with cooling device 40 of FIG. 2. Specifically, battery B and power storage device C1 are placed such that casing 50 for power storage device C1 is stacked above casing 52 for battery B.

Battery B has a structure in which casing 52 as an outer packaging member houses a plurality of battery cells BC1-BC6 mounted on the bottom surface of casing 52. A gap as the cooling wind flow path is formed between the upper surface of battery cells BC1-BC6 and casing 52 and between the stacked battery cells. The gap is in communication with a gap formed in casing 50 for power storage device C1 on a side downstream of battery cells BC1-BC6.

Power storage device C1 has a structure in which casing 50 as an outer packaging member houses therein a substrate on which a plurality of stacked capacitor cells CC1-CC5 are mounted. A gap as the cooling wind flow path is formed between the upper surface of capacitor cells CC1-CC5 and casing 50, between the rear surface of the substrate on which capacitor cells CC1-CC5 are mounted and casing 50, and between the stacked capacitor cells.

Battery B and power storage device C1 are placed such that casing 50 is stacked above casing 52 as shown in FIG. 6. In this instance, opening 46 is provided in a contact surface between casing 52 and casing 50, which allows communication between the gap inside casing 52 and the gap inside casing 50. Opening 46 is provided in the cooling wind flow path on the side downstream of battery cells BC1-BC6.

Cooling fan F10 is placed on one side surface of casing 52 for battery B. An intake duct (not shown) for taking in the cooling wind is provided on a side upstream of cooling fan F10.

Exhaust port 44 is placed in one side surface of casing 50 for power storage device C1. An exhaust duct (not shown) for emitting the cooling wind that has flown through the cooling wind flow path to the outside is provided on a side downstream of exhaust port 44.

In the configuration described above, the cooling wind taken in from cooling fan F10 flows along a direction indicated by arrows in the drawing. Specifically, the cooling wind firstly flows through the gap formed inside casing 52 for battery B. Subsequently, the cooling wind that has passed through battery cells BC1-BC6 is introduced into the inside of casing 50 for power storage device C1 via opening 46. As indicated by the arrows in the drawing, the cooling wind introduced into the inside of casing 50 flows through the gap between the rear surface of the substrate on which capacitor cells CC1-CC5 are mounted and casing 50, and thereafter flows into the gap between the upper surface of capacitor cells CC1-CC5 and casing 50. Then, the cooling wind flows through the gap between the upper surface of capacitor cells CC1-CC5 and casing 50 and the gap between the capacitor cells, and thereafter, the cooling wind is emitted to the outside of casing 50 via exhaust port 44.

According to cooling device 40B of FIG. 6, the cooling wind warmed by heat exchange with battery B flows through power storage device C1, and thereby power storage device C1 collects thermal energy of the cooling wind and is warmed. Therefore, a reduction in the chargeable/dischargeable electric power of power storage device C1 can be suppressed by increasing the temperature of power storage device C1 using heat dissipated from battery B via the cooling wind serving as a medium.

Further, according to cooling device 40B, the temperature of power storage device C1 can be increased more efficiently by placing power storage device C1 and battery B such that casing 50 is stacked above casing 52.

Specifically, heat generated inside battery cells BC1-BC6 is transferred to the substrate on which capacitor cells CC1-CC5 are mounted through casing 52 and the gap formed on the rear surface of the substrate. Capacitor cells CC1-CC5 can be warmed not only by heat exchange with the cooling wind but also by heat exchange with the substrate. As a result, the temperature of power storage device C1 can be increased efficiently.

It is to be noted that, also in cooling device 40B of FIG. 6, the configuration shown in FIG. 5 can be applied to a bonding surface between casing 52 for battery B and casing 50 for power storage device C1. Thereby, the cooling wind warmed by heat exchange with battery B is evenly supplied to capacitor cells CC1-CC5, and thus temperature variations in capacitor cells CC1-CC5 can be eliminated, achieving an even increase in temperature.

As described above, according to the second embodiment of the present invention, under low temperature circumstances, the temperature of a power storage device can be increased using thermal energy collected from a battery, and thus a reduction in charge/discharge electric power of a power supply unit can be suppressed.

Third Embodiment

Figure 7:
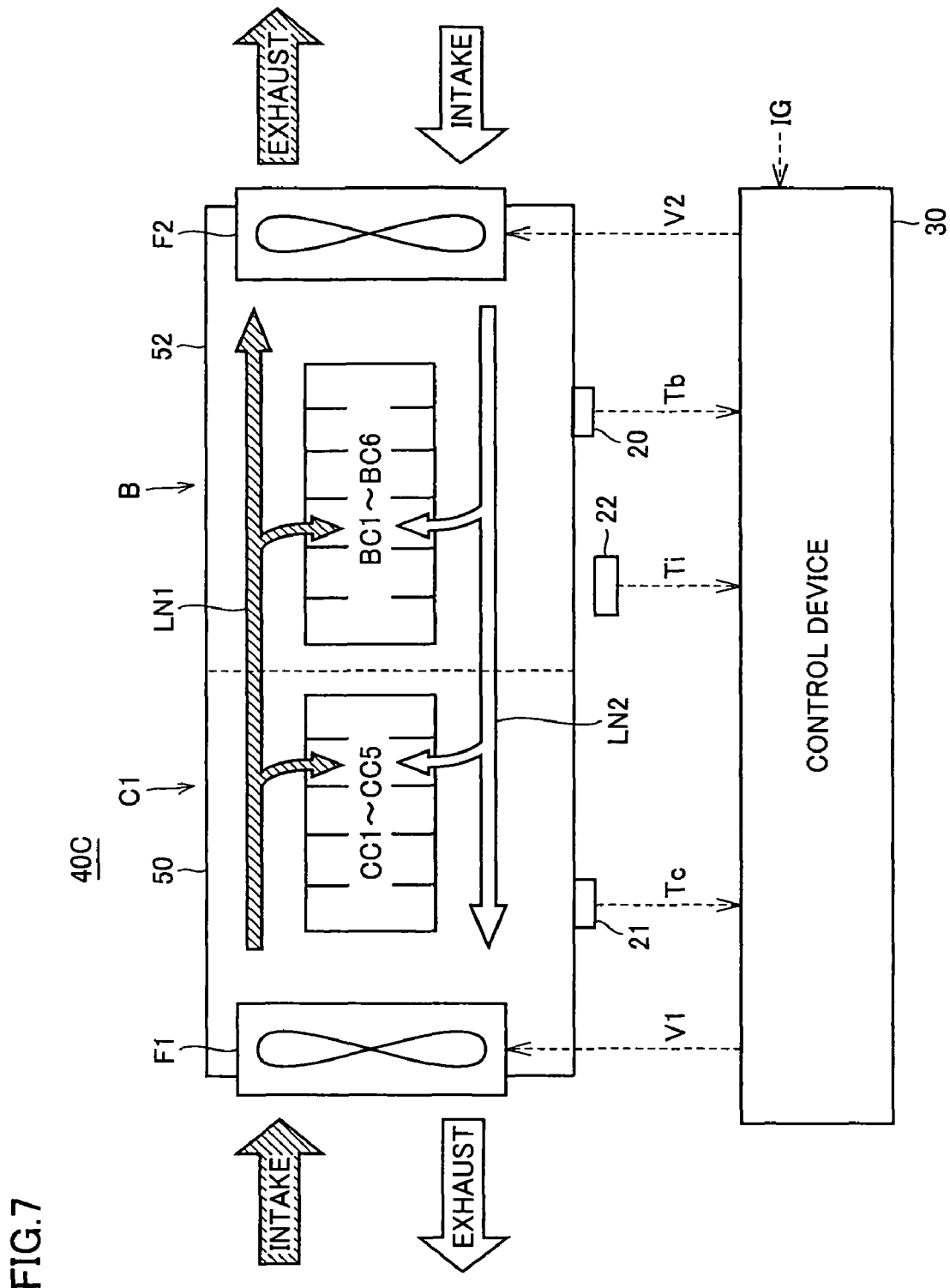
FIG. 7 is an overall configuration diagram of a cooling device in accordance with a third embodiment of the present invention.

FIG. 7 is an overall configuration diagram of a cooling device in accordance with a third embodiment of the present invention.

Referring to FIG. 7, a cooling device 40C includes a cooling fan F1 placed in power storage device C1, a cooling fan F2 placed in battery B, and a cooling wind flow path for allowing cooling wind supplied from cooling fans F1 and F2 to flow therethrough.

Specifically, power storage device C1 has a structure in which casing 50 as an outer packaging member houses a plurality of capacitor cells CC1-CC5 stacked inside casing 50. The plurality of capacitor cells CC1-CC5 have basically the same structure, and are electrically connected in series. A gap as the cooling wind flow path is formed between the upper and lower surfaces of capacitor cells CC1-CC5 and casing 50, and between the stacked capacitor cells, to allow the cooling wind to flow therethrough.

Battery B has a structure in which casing 52 as an outer packaging member houses a plurality of battery cells BC1-BC6 stacked inside casing 52. The plurality of battery cells BC1-BC6 have basically the same structure, and are electrically connected in series. A gap as the cooling wind flow path is formed between the upper and lower surfaces of battery cells BC1-BC6 and casing 52, and between the stacked battery cells, to allow the cooling wind to flow therethrough.

Cooling fan F1 is placed on one side surface of casing 50 for power storage device C1. An intake duct (not shown) for taking in the cooling wind is provided on a side upstream of cooling fan F1.

The other side surface of casing 50 for power storage device C1 is formed as an open end surface, and coupled with one side surface of casing 52 for battery B also constituting an open end surface. That is, the gap formed inside casing 50 and the gap formed inside casing 52 are in communication with each other to form a common cooling wind flow path.

Cooling fan F2 is placed on the other side surface of casing 50 for battery B. An intake duct (not shown) for taking in the cooling wind is provided on a side upstream of cooling fan F2.

Cooling fans F1 and F2 are selectively driven in response to signals V1 and V2 from control device 30 in a manner described later. When cooling fan F1 is selectively driven, the cooling wind taken in from cooling fan F1 flows through the cooling wind flow path along a direction indicated by an arrow LN1 in the drawing.

On this occasion, the cooling wind firstly flows through the gap formed inside casing 50 for power storage device C1 to cool capacitor cells CC1-CC5, and then flows through the gap formed inside casing 52 for battery B to cool battery cells BC1-BC6. Finally, the cooling wind is emitted to the outside via cooling fan F2 serving as an exhaust port.

Specifically, when cooling fan F1 is driven, the cooling wind is supplied to an upstream side of power storage device C1, and flows through power storage device C1 into battery B. Thereby, battery B is cooled by the cooling wind after the cooling wind cools power storage device C1.

In contrast, when cooling fan F2 is selectively driven, the cooling wind taken in from cooling fan F2 flows through the cooling wind flow path along a direction indicated by an arrow LN2 in the drawing.

On this occasion, the cooling wind firstly flows through the gap formed inside casing 52 for battery B to cool battery cells BC1-BC6, and then flows through the gap formed inside casing 50 for power storage device C1 to cool capacitor cells CC1-CC5. Finally, the cooling wind is emitted to the outside via cooling fan F1 serving as an exhaust port.

Specifically, when cooling fan F2 is driven, the cooling wind is supplied to an upstream side of battery B, and flows through battery B into power storage device C1. Thereby, power storage device C1 is cooled by the cooling wind after the cooling wind cools battery B.

As described above, according to cooling device 40C in accordance with the present embodiment, the direction in which the cooling wind flows can be switched by selectively driving cooling fans F1 and F2 provided in the common cooling wind flow path. Although cooling device 40C has more cooling fans when compared with aforementioned cooling device 40, cooling device 40C not only has a function of cooling power storage device C1 and battery B but also has a function of increasing the temperatures thereof. That is, cooling device 40C constitutes a temperature adjustment device for power storage device C1 and battery B.

Hereinafter, drive control for cooling fans F1 and F2 will be described.

The drive control for cooling fans F1 and F2 is performed by control device 30. Control device 30 receives battery temperature Tb from temperature sensor 20, capacitor temperature Tc from temperature sensor 21, and an ambient temperature Ti around the power supply unit from temperature sensor 22. Based on these pieces of temperature information, control device 30 selects a cooling fan to be driven.

Specifically, control device 30 firstly determines whether or not ambient temperature Ti is higher than a prescribed threshold value T_std. The prescribed threshold value T_std is set, for example, to ambient temperature Ti at which a reduction in inputtable/outputtable electric power of battery B is observed. According to the determination result, control device 30 selects a cooling fan to be driven in a manner described below. Thereby, a cooling fan to be driven is selected in different manners when the power supply unit is at an ordinary temperature and when it is at a low temperature.

(1) When the Power Supply Unit is at an Ordinary Temperature

When control device 30 determines that ambient temperature Ti is higher than the prescribed threshold value T_std, control device 30 then determines whether or not battery temperature Tb is higher than capacitor temperature Tc.

When control device 30 determines that battery temperature Tb is higher than capacitor temperature Tc, control device 30 selects cooling fan F1 as a cooling fan to be driven. Then, control device 30 determines a wind blowing amount V1 of cooling fan F1 based on battery temperature Tb, generates a signal V1 indicating the determined wind blowing amount V1, and outputs signal V1 to cooling fan F1.

Thereby, in cooling fan F1, a control duty command value for an inverter driving an internal fan motor is determined to obtain wind blowing amount V1 indicated by signal V1. Then, based on the determined control duty command value, the inverter converts DC power from an auxiliary battery into AC power and drives the fan motor. As a result, the cooling wind having wind blowing amount V1 taken in from cooling fan F1 and supplied to the upstream side of power storage device C1 firstly cools power storage device C1 with a lower temperature, and then cools battery B with a higher temperature.

In contrast, when control device 30 determines that battery temperature Tb is not more than capacitor temperature Tc, control device 30 selects cooling fan F2 as a cooling fan to be driven. Then, control device 30 determines a wind blowing amount V2 of cooling fan F2 based on capacitor temperature Tc, generates a signal V2 indicating the determined wind blowing amount V2, and outputs signal V2 to cooling fan F2.

Thereby, in cooling fan F2, a control duty command value for an inverter driving an internal fan motor is determined to obtain wind blowing amount V2 indicated by signal V2. Then, based on the determined control duty command value, the inverter converts DC power from an auxiliary battery into AC power and drives the fan motor. As a result, the cooling wind having wind blowing amount V2 taken in from cooling fan F2 and supplied to the upstream side of battery B firstly cools battery B with a lower temperature, and then cools power storage device C1 with a higher temperature.

As described above, when ambient temperature Ti of the power supply unit is higher than the prescribed threshold value T_std, that is, when the power supply unit is at an ordinary temperature, battery B and power storage device C1 can be cooled using common cooling wind by allowing the cooling wind to flow from power storage device C1 (or battery B) with a lower temperature to battery B (or power storage device C1) with a higher temperature.

Further, both battery B and power storage device C1 can be cooled reliably by determining the amount of blowing the cooling wind based on the temperature of battery B (or power storage device C1) with a higher temperature.

(2) When the Power Supply Unit is at a Low Temperature

When control device 30 determines that ambient temperature Ti is not more than the prescribed threshold value T_std, control device 30 then determines whether or not battery temperature Tb is higher than capacitor temperature Tc.

When control device 30 determines that battery temperature Tb is higher than capacitor temperature Tc, control device 30 selects cooling fan F2 as a cooling fan to be driven. Then, control device 30 determines wind blowing amount V2 of cooling fan F2 based on battery temperature Tb, generates signal V2 indicating the determined wind blowing amount V2, and outputs signal V2 to cooling fan F2.

Thereby, in cooling fan F2, a control duty command value for the inverter driving the internal fan motor is determined to obtain wind blowing amount V2 indicated by signal V2, and the fan motor is driven based on the determined control duty command value. As a result, the cooling wind having wind blowing amount V2 taken in from cooling fan F2 and supplied to the upstream side of battery B flows, through battery B with a higher temperature, into power storage device C1 with a lower temperature.

On this occasion, the cooling wind warmed by heat exchange with battery B flows through power storage device C1. Thereby, power storage device C1 collects thermal energy of the cooling wind and is warmed. The electric double layer capacitors constituting power storage device C1 have temperature dependence of capacitance, and have a characteristic that a reduction in temperature causes a reduction in chargeable/dischargeable electric power, as with battery B. Therefore, when power storage device C1 is at a low temperature, a reduction in chargeable/dischargeable electric power can be suppressed by increasing the temperature of power storage device C1 using heat dissipated from battery B via the cooling wind serving as a medium.

In contrast, when control device 30 determines that battery temperature Tb is not more than capacitor temperature Tc, control device 30 selects cooling fan F1 as a cooling fan to be driven. Then, control device 30 determines wind blowing amount V1 of cooling fan F1 based on capacitor temperature Tc, generates signal V1 indicating the determined wind blowing amount V1, and outputs signal V1 to cooling fan F1.

Thereby, in cooling fan F1, a control duty command value for the inverter driving the internal fan motor is determined to obtain wind blowing amount V1 indicated by signal V1, and the fan motor is driven based on the determined control duty command value. As a result, the cooling wind having wind blowing amount V1 taken in from cooling fan F1 and supplied to the upstream side of power storage device C1 flows, through power storage device C1 with a higher temperature, into battery B with a lower temperature.

On this occasion, the cooling wind warmed by heat exchange with power storage device C1 flows through battery B. Thereby, battery B collects thermal energy of the cooling wind and is warmed, and thus a reduction in chargeable/dischargeable electric power can be suppressed.

As described above, when ambient temperature Ti of the power supply unit is not more than the prescribed threshold value T_std, that is, when the power supply unit is at a low temperature, the temperature of power storage device C1 (or battery B) with a lower temperature can be increased by allowing the cooling wind to flow from battery B (or power storage device C1) with a higher temperature to power storage device C1 (or battery B) with a lower temperature. As a result, a reduction in the chargeable/dischargeable electric power of battery B and power storage device C1 under low temperature circumstances can be prevented, showing the true fuel economy of a hybrid vehicle.

Figure 8:
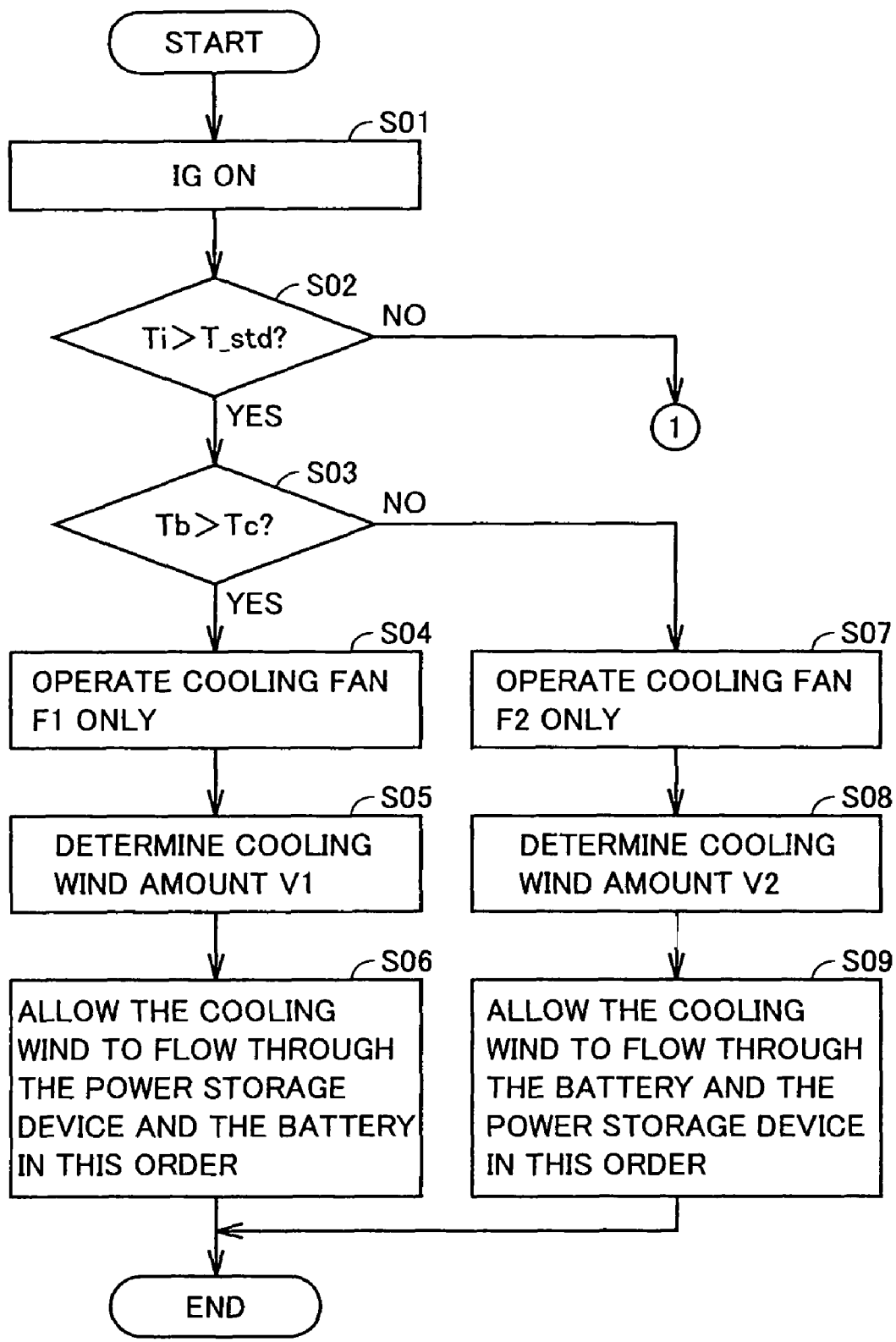
FIG. 8 is a flow chart for illustrating drive control for the cooling device of FIG. 7.

FIGS. 8 and 9 are flow charts for illustrating drive control for cooling device 40C of FIG. 7. The drive control described below is performed by control device 30 in charge of controlling the entire motor drive device 100.

Referring to FIG. 8, firstly, in response to an ignition key IG being turned ON (step S01), control device 30 determines whether or not ambient temperature Ti of the power supply unit is higher than the prescribed threshold value T_std (step S02). When control device 30 determines in step S02 that ambient temperature Ti is higher than the prescribed threshold value T_std, i.e., that the power supply unit is under ordinary temperature circumstances, control device 30 then determines whether or not battery temperature Tb is higher than capacitor temperature Tc (step S03).

When control device 30 determines in step S03 that battery temperature Tb is higher than capacitor temperature Tc, control device 30 selects cooling fan F1 as a cooling fan to be driven, and operates cooling fan F1 (step S04). Then, control device 30 determines wind blowing amount V1 of cooling fan F1 based on battery temperature Tb, generates signal V1 indicating the determined wind blowing amount V1, and outputs signal V1 to cooling fan F1 (step S05). Thereby, the cooling wind having wind blowing amount V1 taken in from cooling fan F1 and supplied to the upstream side of power storage device C1 flows, through power storage device C1 with a lower temperature, into battery B with a higher temperature, and cools the both (step S06).

In contrast, when control device 30 determines in step S03 that battery temperature Tb is not more than capacitor temperature Tc, control device 30 selects cooling fan F2 as a cooling fan to be driven, and operates cooling fan F2 (step S07). Then, control device 30 determines wind blowing amount V2 of cooling fan F2 based on capacitor temperature Tc, generates signal V2 indicating the determined wind blowing amount V2, and outputs signal V2 to cooling fan F2 (step S08). Thereby, the cooling wind having wind blowing amount V2 taken in from cooling fan F2 and supplied to the upstream side of battery B flows, through battery B with a lower temperature, into power storage device C1 with a higher temperature, and cools the both (step S09).

Next, referring to FIG. 9, when control device 30 determines in step S02 of FIG. 8 that ambient temperature Ti is not more than the prescribed threshold value T_std, i.e., that the power supply unit is under low temperature circumstances, control device 30 then determines whether or not battery temperature Tb is higher than capacitor temperature Tc (step S10).

When control device 30 determines in step S10 that battery temperature Tb is higher than capacitor temperature Tc, control device 30 selects cooling fan F2 as a cooling fan to be driven, and operates cooling fan F2 (step S11). Then, control device 30 determines wind blowing amount V2 of cooling fan F2 based on battery temperature Tb, generates signal V2 indicating the determined wind blowing amount V2, and outputs signal V2 to cooling fan F2 (step S12). Thereby, the cooling wind having wind blowing amount V2 taken in from cooling fan F2 and supplied to the upstream side of battery B flows, through battery B with a higher temperature, into power storage device C1 with a lower temperature (step S13). As a result, power storage device C1 absorbs thermal energy dissipated by battery B from the cooling wind, and increases the temperature.

In contrast, when control device 30 determines in step S10 that battery temperature Tb is not more than capacitor temperature Tc, control device 30 selects cooling fan F1 as a cooling fan to be driven, and operates cooling fan F1 (step S14). Then, control device 30 determines wind blowing amount V1 of cooling fan F1 based on capacitor temperature Tc, generates signal V1 indicating the determined wind blowing amount V1, and outputs signal V1 to cooling fan F1 (step S15). Thereby, the cooling wind having wind blowing amount V1 taken in from cooling fan F1 and supplied to the upstream side of power storage device C1 flows, through power storage device C1 with a higher temperature, into battery B with a lower temperature (step S16). As a result, battery B absorbs thermal energy dissipated by power storage device C1 from the cooling wind, and increases the temperature.

As described above, according to the third embodiment of the present invention, a battery and a power storage device serving as an electric power supply source for a motor can be cooled using common cooling wind, and further, under low temperature circumstances, the temperature of either one of the battery and the power storage device can be increased using thermal energy collected from the other thereof. As a result, the battery and the power storage device can be adjusted to be within a prescribed allowable temperature range, and thus performance degradation can be suppressed.

The first to third embodiments described above have illustrated the case where the present invention is applied to a series/parallel type hybrid vehicle in which motive power of an engine can be split by a motive power split mechanism and separately transmitted to an axle and to a generator. However, the present invention is also applicable to a series type hybrid vehicle in which an engine is used to drive a generator, and drive force of an axle is generated only by a motor using electric power generated by the generator, as well as to an electric vehicle run only by a motor. In both of these configurations, an axle is connected with a motor or a generator, and regenerative energy generated at the time of deceleration can be collected and stored in a battery and a capacitor. Therefore, the present invention is applicable thereto.

It should be understood that the embodiments disclosed herein are illustrative and non-restrictive in every respect. The scope of the present invention is defined by the scope of the claims, rather than the description above, and is intended to include any modifications within the scope and meaning equivalent to the scope of the claims.

INDUSTRIAL APPLICABILITY

The present invention is applicable to a power supply unit having a power supply and a power storage device as an electric power supply source to a load, and a method of cooling the power supply unit.

What is claimed is:

1. A power supply unit, comprising:
a first power supply provided to be capable of supplying electric power to a load, and having a relatively large amount of heat generated by charge or discharge associated with driving said load;
a second power supply connected to said load in parallel with said first power supply for supplying electric power to said load to assist said first power supply with insufficient electric power, and having a smaller amount of heat, compared with the first power supply, generated by charge/discharge associated with driving said load; and
a cooling device cooling said first power supply and said second power supply,
said cooling device including:
a cooling medium supply unit supplying a cooling medium to an upstream part of said second power supply, and
a cooling medium flow path formed to allow said cooling medium supplied by said cooling medium supply unit to flow through said second power supply into said first power supply,
wherein;
said first power supply includes:
a first substrate having a first main surface on which a plurality of first power supply cells are mounted; and
a first casing housing said first substrate and provided with a first communication path for emitting said cooling medium flowing through said cooling medium flow path to an outside of said power supply unit,
said second power supply includes:
a second substrate having a first main surface on which a plurality of second power supply cells are mounted; and
a second casing housing said second substrate and provided with a second communication path for introducing said cooling medium from said cooling medium supply unit into said cooling medium flow path,
said first communication path and said second communication path are connected by a third communication path to allow communication therebetween, and
said second casing is placed in contact with said first casing and heat transfer is conducted between a second main surface, which is an opposite side of the first main surface, of said first substrate and the second casing.

2. The power supply unit according to claim 1, wherein said third communication path is made of a plurality of ventilation holes formed in a bonding surface between said first casing and said second casing, and
said plurality of ventilation holes are formed to have opening areas increased with distance from said cooling medium supply unit.

3. A power supply unit, comprising:
a first power supply provided to be capable of supplying electric power to a load, and having a relatively large amount of heat generated by charge or discharge associated with driving said load;
a second power supply connected to said load in parallel with said first power supply for supplying electric power to said load to assist said first power supply with insufficient electric power, and having a relatively small amount of heat generated by charge/discharge associated with driving said load; and
a temperature adjustment device adjusting temperatures of said first power supply and said second power supply,
said temperature adjustment device including:
a cooling medium supply unit supplying a cooling medium to an upstream part of said first power supply, and a cooling medium flow path formed to allow said cooling medium supplied from said cooling medium supply unit to flow through said first power supply into said second power supply, said first power supply including:

a first substrate having a first main surface on which a plurality of first power supply cells are mounted; and a first casing housing said first substrate and provided with a first communication path for introducing said cooling medium from said cooling medium supply unit into said cooling medium flow path, said second power supply including:

a second substrate having a first main surface on which a plurality of second power supply cells are mounted; and a second casing housing said second substrate and provided with a second communication path for emitting said cooling medium flowing through said cooling medium flow path to an outside of said power supply unit, said first communication path and said second communication path are connected by a third communication path to allow communication therebetween, and said first casing is placed in contact with said second casing and heat transfer is conducted between a second main surface, which is an opposite side of the first main surface, of said second substrate and the first casing.

4. The power supply unit according to claim 3, wherein said third communication path is made of a plurality of ventilation holes formed in a bonding surface between said first casing and said second casing, and said plurality of ventilation holes are formed to have opening areas increased with distance from said cooling medium supply unit.

5. The power supply unit according to claim 1, wherein said first power supply is a secondary battery, and said second power supply is a capacitor.

6. The power supply unit according to claim 1, wherein said load is a motor for driving a vehicle, and said power supply unit is mounted in the vehicle as an electric power supply source for said motor.

* * * * *